United States Patent [19]

Schowe, Jr.

[11] 3,878,482

[45] Apr. 15, 1975

[54] WIDE-BAND, VOLTAGE CONTROLLED OSCILLATOR UTILIZING COMPLIMENTARY METAL OXIDE SEMICONDUCTOR INTEGRATED CIRCUITS AND A CONSTANT CURRENT MOS-FET FIELD EFFECT TRANSISTOR

[75] Inventor: Lester F. Schowe, Jr., Endwell, N.Y.

[73] Assignee: General Electric Company, Binghamton, N.Y.

[22] Filed: Oct. 4, 1973

[21] Appl. No.: 403,472

[52] U.S. Cl. .............................. 331/108 D; 331/111

[51] Int. Cl. .............................................. H03k 3/282

[58] Field of Search ..................... 331/108, 111, 113

[56] References Cited

UNITED STATES PATENTS 3,702,446 11/1972 Steudel .......................... 331/108 D

OTHER PUBLICATIONS

RCA Publication, "Digital Integrated Circuits," Mar. 1971, pgs. 353–360.

*Primary Examiner*—John Kominski

*Attorney, Agent, or Firm*—I. David Blumenfeld

[57] ABSTRACT

A wide-band, voltage controlled oscillator is described which has a frequency range of six decades. The voltage controlled oscillator (VCO), which uses complementary metal oxide, semiconductor field effect transistor elements (C-MOS-FET's), is basically an astable multivibrator which is operated from a voltage controlled, variable amplitude, constant current source. The constant current source includes a p-channel MOS-FET operated in a saturated mode to provide a constant current which may be selectively varied as a function of the gate to source voltage. The current source is coupled to a capacitor storage element through a pair of C-MOS-FET's which selectively establish a conducting path between the capacitor and the constant current source to charge and discharge the capacitor. The C-MOS-FET elements through which the capacitor charges and discharges are controlled by a C-MOS-FET switch means which is actuated in response to the voltage level on the capacitor. By utilizing a constant current source to charge the capacitor, linear charging is easily achieved. Furthermore, the rate at which the capacitor is charged, and hence, the oscillator frequency, may be readily varied over a wide range of values by varying the current level as a function of the input voltage applied to the gate of the constant current p-channel MOS-FET. In one example, a VCO is described which is capable of operating over a frequency range from 5 Hz to 5.5 MHz, and may, in one application described herein, form part of a Phase Locked Loop which is capable of operating over a dynamic frequency range of five decades, i.e., 50 Hz to 5 MHz.

8 Claims, 3 Drawing Figures

Figure 1:
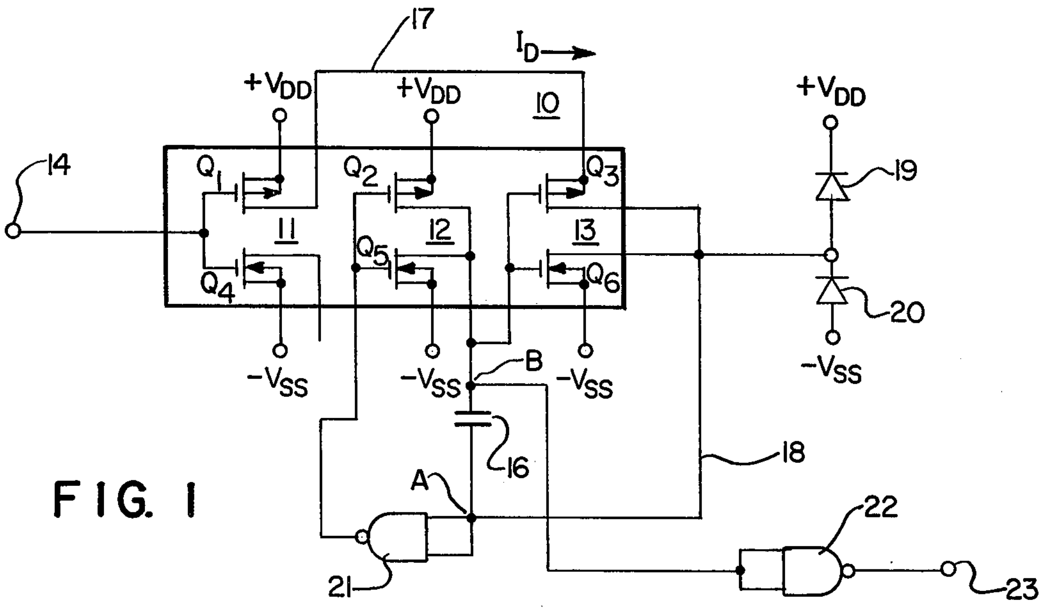

WIDE-BAND, VOLTAGE CONTROLLED OSCILLATOR UTILIZING COMPLIMENTARY METAL OXIDE SEMICONDUCTOR INTEGRATED CIRCUITS AND A CONSTANT CURRENT MOS-FET FIELD EFFECT TRANSISTOR

The instant invention relates to a voltage controlled oscillator (VCO) useful in a Phase Locked Loop, and more particularly, to a voltage controlled oscillator which has a very wide dynamic frequency range and which may be constructed in the form of an integrated circuit using complementary, metal oxide semiconductor, field effect transistors (C-MOS-FET's).

Voltage controlled oscillator circuits, as the name indicates, are signal generators which produce output signals, the frequency of which vary as a function of an input control voltage. Such voltage controlled oscillators have a variety of applications in measuring and sensing circuits; in Phase Locked Loops; and, in fact, in any situation where a variable frequency output signal is required as a function of an input voltage. The prior art voltage controlled oscillators (VCO) have, however been characterized by a fairly limited frequency range. Typically, prior art VCO's have a dynamic frequency range limited to half a decade so that the oscillator frequency excursion is limited to a range of about 5 to 1. This limited operational range obviously circumscribes the usefulness of the VCO in many applications. Thus, there is a need for a voltage controlled oscillator which has a very wide dynamic frequency range, i.e., several decades or more, which is relatively uncomplicated from a circuit standpoint, and which, preferably, may be fabricated on a single integrated circuit chip.

It is therefore a primary objective of the instant invention to provide a wide range, voltage controlled oscillator having a dynamic frequency range of several decades.

Another objective of the invention is to provide a wide range voltage controlled oscillator which has a dynamic frequency range of at least 6 decades.

Still another objective of the invention is to provide a wide range voltage controlled oscillator which utilizes integrated circuit components of the metal oxide, semiconductor (MOS) type.

A further objective of the invention is to provide a wide range, voltage controlled oscillator which utilizes metal oxide, semiconductor components which may be fabricated and a single integrated circuit chip.

Yet another objective of the invention is to provide a wide range, voltage controlled, oscillator utilizing complementary, metal oxide, semiconductor (C-MOS) components which include a voltage controlled constant current source.

Still a further objective of the invention is to provide a phase locked loop utilizing a voltage controlled oscillator having a wide dynamic frequency range and constructed of metal oxide, semiconductor integrated circuits.

Yet a further objective of the invention is to produce a wide range voltage controlled oscillator which minimizes circuit complexity, may be fabricated by integrated circuit techniques, and is easy to manufacture.

Other objectives and advantages of the invention will become apparent as the description thereof proceeds.

The various objectives and advantages of the invention are realized in an arrangement in which a plurality of complementary, metal oxide, semiconductor field effect transistor pairs (hereinafter referred to as C-MOS-FET's) mounted on a single chip or substrate are interconnected with a storage capacitor in an astable multivibrator configuration. One of the C-MOS field effect transistors of one pair is utilized as a saturated constant current source, a second C-MOS-FET pair alternately establishes a charging and discharging path for one side of the capacitor, and the remaining C-MOS-FET pair is utilized as a switching element for controlling the charge and discharge path and also for connecting the storage capacitor to different reference potentials. A voltage sensing gating or switch element is connected between the capacitor and the switching elements to initiate switching whenever the voltage across the capacitor reaches a predetermined level or threshold, thereby instantaneously switching the capacitor connection to produce alternate charging and discharging of the capacitor.

By varying the voltage applied to the constant current source, the level of current from the constant current source may be selectively varied thereby varying the time constant or charging rate of the capacitor and hence, the frequency of the output from the voltage controlled oscillator.

The novel features which are believed to be characteristic of this invention are set forth with particularity in the appended claims. The invention itself, however, both as to its organization and mode of operation, together with further objectives and advantages, may best be understood by reference to the following description taken in connection with the according drawing in which:

FIG. 1 is a circuit diagram of the voltage controlled oscillator of the instant invention.

FIG. 2*a* and *b* are wave form diagrams useful in understanding the operation of the voltage controlled oscillator.

Figure 3:
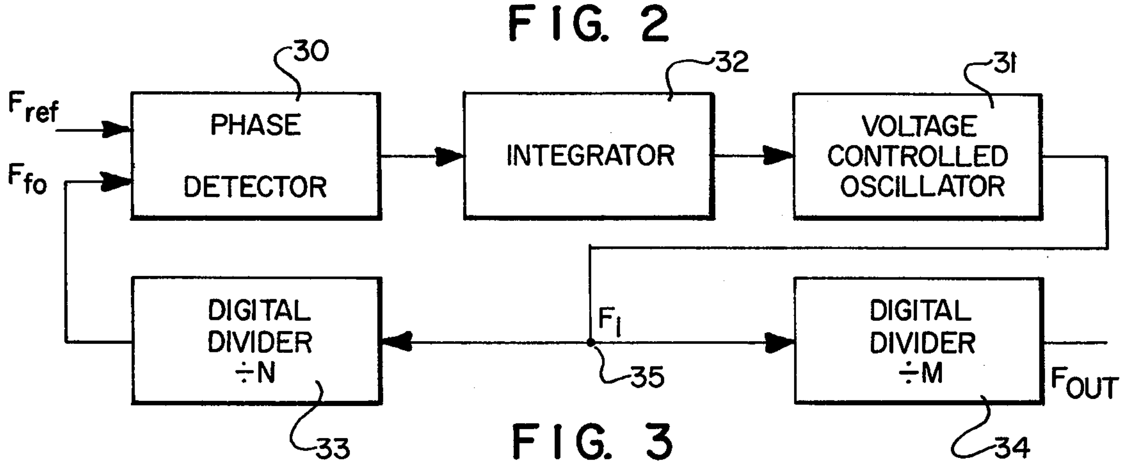

FIG. 3 is a block diagram of a phase locked loop including the voltage controlled oscillator of the instant invention.

The voltage controlled oscillator embodying the instant invention is shown in FIG. 1 and consists of a plurality of C-MOS-FET pairs 11, 12 and 13 mounted on a common substrate or chip 10; a capacitor 16; a NAND gate 21 and buffer 22. Although the circuit implementation is shown using standard C-MOS integrated circuits, it will be apparent that the invention is not limited thereto since the circuit can be implemented using a single integrated circuit chip. The benefits and advantages which flow from fabricating the entire assembly on a single chip are apparent and will obviously result in a smaller, more compact device.

Each of the C-MOS-FET pairs 11, 12 and 13 includes a p-channel enhancement MOS-FET, $Q_1$, $Q_2$ and $Q_3$ and an n-channel enhancement MOS-FET $Q_4$, $Q_5$ and $Q_6$. C-MOS-FET pair 11 consists of p-channel MOS-FET $Q_1$ and n-channel MOS-FET $Q_4$ connected in series across the power supply while C-MOS-FET pair 12 consists of p and n-channel MOS-FET's $Q_2$ and $Q_5$ connected in series between $+V_{DD}$ and $-V_{SS}$. C-MOS-FET pair 13 consists of p and n-channel MOS-FET's $Q_3$ and $Q_6$ connected in series between MOS-FET $Q_1$ of C-MOS-FET pair 11 and $-V_{SS}$ with the source electrode of $Q_3$ connected to drain electrode 15 of MOS-FET $Q_1$ via lead 17 while the source electrode of MOS-FET $Q_6$ is connected to $-V_{SS}$.

P-channel MOS-FET $Q_1$ functions as a voltage controlled, constant current source and to this end, the gate electrode of p-channel MOS-FET $Q_1$ is connected to an input terminal 14 which has a suitable control voltage impressed thereon. The drain source voltages $+V_{DD}$ and $-V_{SS}$ are of such polarity and magnitude that p-channel MOS-FET $Q_1$ is biased to operate in the saturated region and thus acts as a constant current source for any given input voltage between $+V_{DD}$ and $-V_{SS}$. That is, the p-channel MOS-FET is biased into saturation so that the magnitude of the saturation drain current $I_D$ flowing at drain electrode 15 is constant for a given gate-source voltage applied at input terminal 14. However, the magnitude of the saturated drain current may be varied by varying the gate to source voltage $V_{sg}$ applied at input terminal 14 and thus, the level of the constant drain current $I_D$ may be controlled by varying $V_{sg}$. It will be apparent that n-channel MOS-FET $Q_4$ of C-MOS-FET pair 11 is not utilized as part of the constant current source and could be dispensed with. However, since it is part of a standard C-MOS-FET pair, it is left in place on the chip but not utilized.

Voltage controlled constant current source $Q_1$ is connected to storage capacitor 16 through C-MOS-FET pair 13 to charge the capacitor at a rate proportional to the magnitude of drain current $I_D$. The complementary p and n channel transistor $Q_3$ and $Q_6$ alternately establish a conducting path between the capacitor and constant current source $Q_1$ and between the capacitor and a reference current source to permit selective charging and discharging of capacitor 16. Since the source electrode of p-channel MOS-FET $Q_3$ is connected to the drain electrode of p-channel transistor $Q_1$ by lead 17, and the drain electrode of $Q_3$ is connected directly to one side of capacitor 16 (shown as point A) by lead 18, it is obvious that the constant current source $Q_1$ is connected to capacitor 16 whenever $Q_3$ conducts.

Alternatively, when n-channel MOS-FET $Q_6$ is in the conducting state, capacitor 16 is connected to $Q_6$ which functions as a fixed reference current source. Thus, with p-channel MOS-FET $Q_3$ conducting, the current $I_D$ from voltage controlled constant current source $Q_1$ flows through MOS-FET $Q_3$ and over lead 18 to charge capacitor 16. The rate at which capacitor 16 charges is a function of the amplitude of the drain current $I_D$ which in turn, may be varied by the gate to source voltage $V_{gs}$ impressed on the gate of $Q_1$. When the conducting states of transistors $Q_3$ and $Q_6$ reverse to turn-off p-channel MOS-FET $Q_3$ and drive n-channel MOS-FET $Q_6$ into conduction, point A and capacitor 16 are connected by lead 18 to $Q_6$ so that capacitor 16 discharges at a rate determined by the maximum drain current of n-channel MOS-FET $Q_6$. The C-MOS-FET pair 13 consisting of MOS-FET transistors $Q_3$ and $Q_6$ thus functions as a charging and discharging path for capacitor 16 and controls the flow of current to the capacitor.

The conducting states of $Q_3$ and $Q_6$ in the charging and discharging path are controlled by a switching means which responds to the voltage level on capacitor 16 so that the circuit functions essentially as a free-running astable multivibrator. To this end, the control or gate electrodes of the C-MOS-FET pair 12, which includes p-channel MOS-FET $Q_2$ and n-channel MOS-FET $Q_5$ connected in series between $+V_{DD}$ and $-V_{SS}$, are coupled to point A of capacitor 16 through NAND Gate 21 and the output drain electrodes coupled to the gate electrodes of MOS-FET transistors $Q_3$ and $Q_6$ and to the other side of capacitor 16 (shown as point B). When n-channel MOS-FET $Q_5$ is in the conducting state, the voltage at the drain electrodes is essentially the voltage at the negative terminal $-V_{SS}$. As a result, p-channel MOS-FET transistor $Q_3$ is driven into conduction connecting constant current source $Q_1$ to point A of storage capacitor 16. Alternatively, when p-MOS-FET transistor $Q_2$ is conducting the positive $+V_{DD}$ voltage is applied to the gate electrodes of transistors $Q_3$ and $Q_6$ driving the n-channel MOS-FET $Q_6$ into conduction and connecting point A of the storage capacitor to $-V_{SS}$ and discharging the capacitor at a rate determined by the drain current of the n-channel MOS-FET $Q_6$.

A pair of protective diodes 19 and 20, which in actuality, are part of the internal protective circuits of transistors $Q_3$ and $Q_6$ are connected in series across $+V_{DD}$ and $-V_{SS}$ and their junction is connected to point A, i.e., to the lower plate of capacitor 16. The cathode of diode 19 and the anode of diode 20 are respectively connected to the positive $+V_{DD}$ terminal and the negative $-V_{SS}$ terminal so that they are normally reverse biased. Diodes 19 and 20 conduct only if the voltage at point A exceeds $+V_{DD}$ or $-V_{SS}$ thereby limiting the excursion of the voltage at point A of capacitor 16. Whenever point A becomes more positive than $+V_{DD}$, diode 19 conducts and similarly, when point A becomes more negative than $-V_{SS}$, diode 20 conducts. Thus, the positive excursion of point A which is controlled by diode 19 is limited to $+V_{DD}$ plus the forward voltage drop of diode 19, which is approximately 1 volt, i.e., $(V_{DD} + 1)$. Similarly, the negative excursion of point A which is controlled by diode 20 is limited to the negative voltage $-V_{SS}$ less the forward voltage drop of diode 20, i.e., $(-V_{SS} - 1)$.

The switching of MOS-FET's $Q_2$ and $Q_5$ which form part of the oscillator switching means is controlled by a voltage sensitive logic element 21 which is shown as a NAND gate having its two input terminals connected to point A and its output connected to the gate electrodes of MOS-FET's $Q_2$ and $Q_5$. Whenever voltage at point A is below a reference voltage $V_0$ which controls switching of gate 21 and which may, for example, be ground potential, the output of NAND gate 21 is positive. With the output of NAND gate positive, n-channel MOS-FET $Q_5$ is biased into conduction. The output $Q_5$ which is connected to point B of capacitor 16 and to the gates of $Q_3$ and $Q_6$ is essentially at $-V_{SS}$ and $Q_3$ is conducting. Whenever the voltage at point A exceeds the threshold level $V_0$, the output of NAND gate 21 becomes negative thereby driving p-channel MOS-FET $Q_2$ into conduction and n-channel MOS-FET $Q_5$ into the non-conducting state. This connects point B and the gate electrodes of $Q_3$ and $Q_6$ to the positive $+V_{DD}$ terminal through MOS-FET $Q_2$. As the conducting states of $Q_2$ and $Q_5$ are reversed, MOS-FET's $Q_3$ and $Q_6$ are similarly switched to connect point A of capacitor 16 either to constant current source $Q_1$ through p-channel MOS-FET $Q_3$ or to n-channel MOS-FET $Q_6$.

Figure 2:
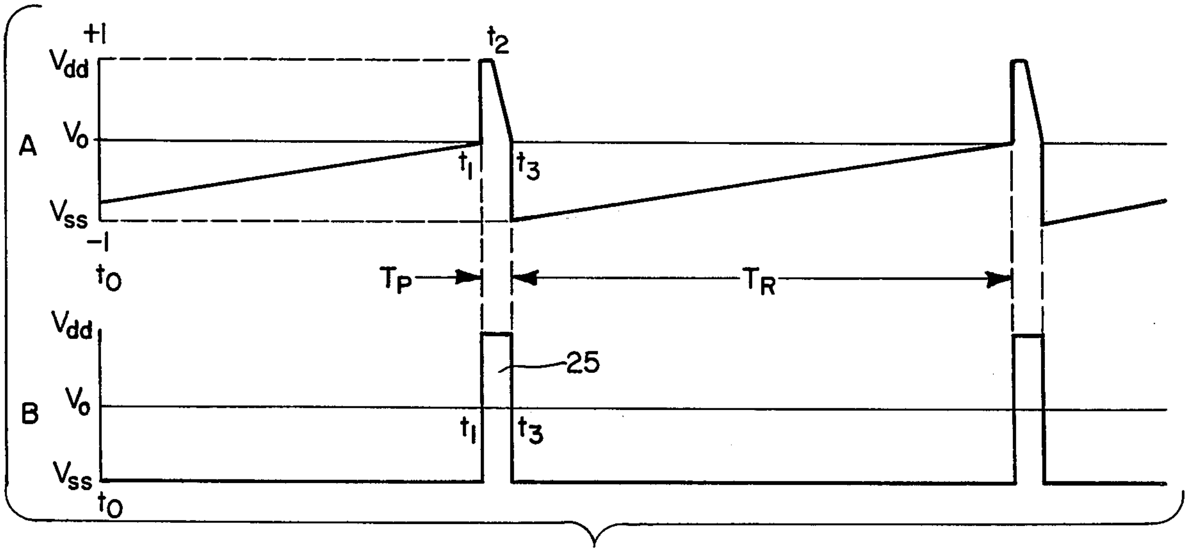

The operation of the voltage controlled oscillator of FIG. 1 may be best understood in connection with the wave form diagrams illustrated in FIGS. 2*a* and 2*b* which show the variations of the voltages at points A and B of capacitor 16 and hence, the manner in which the frequency of the oscillator may be varied as a function of the input voltage to terminal 14. FIG. 2$a$ illustrates the voltage variations at point A and the lower plate of capacitor 16 and FIG. 2$b$ illustrates the voltage variations at point B and the upper plate of capacitor 16 with the voltage variations at point B representing the output of the oscillator which is coupled through a buffer 22 to terminal 23. At time $t_0$ as shown in FIG. 2$a$, the voltage at point A is at some value which is more negative than the threshold voltage $V_0$ for NAND gate 21. Consequently, the output of the voltage sensitive logic element represented by NAND gate 21 is positive. N-channel MOS-FET $Q_5$ is therefore in the conducting state connecting point B to the $-V_{SS}$ terminal so that the upper plate B of capacitor 16 is, as illustrated in FIG. 2$b$, clamped at $-V_{SS}$. The negative voltage $-V_{SS}$ at point B also controls charging and discharging path formed by C-MOS-FET pair 13 so that p-channel MOS-FET $Q_3$ is conducting and the n-channel MOS-FET $Q_6$ is non-conducting. With $Q_3$ conducting, the lower plate of capacitor 16, i.e., point A, is connected to the source of constant current $I_D$ and capacitor 16 is charging in the positive direction so that point A becomes progressively more positive relative to point B. Capacitor 16 continues to charge in the positive direction until at time $t_1$, the voltage across the capacitor is sufficiently large that point A reaches the threshold voltage $V_0$. As point A becomes more positive than $V_0$, which is the logic threshold of the logic element 21, the output of NAND gate 21 switches and goes negative so that n-channel MOS-FET $Q_5$ becomes non-conducting and p-channel MOS-FET $Q_2$ is driven into the conducting state. As a result, the voltage at the output of MOS-FET's $Q_2$ and $Q_5$ goes from approximately $-V_{SS}$ to $+V_{DD}$. Hence, at time $t_1$, point B is driven almost instantaneously from $-V_{SS}$ to $+V_{DD}$.

As point B goes from $-V_{SS}$ to $+V_{DD}$ at $t_1$, p-channel transistor $Q_3$ is turned off and n-channel MOS-FET $Q_6$ is switched into conduction connecting point A to $-V_{SS}$. Even though n-channel transistor $Q_6$ is now conducting, capacitor 16 cannot discharge instantaneously so that the voltage at point A goes sharply positive at $t_1$.

That is, the transition at point B of capacitor 16 from $-V_{SS}$ to $+V_{DD}$ causes point A to be instantly driven in a positive direction by an amount $\Delta V_1$ equal to $\Delta V_1 = V_{DD} - (-V_{SS})$ where $V_1$ is equal to the transition voltage at point B.

Point A does not, however, rise to the full value of $V_0 + \Delta V_1$ since diode 19 is driven into conduction when point A exceeds $+V_{DD}$ so that the excursion at point A is clamped at $+V_{DD} + 1$ volt, i.e., $+V_{DD}$ plus the forward voltage drop of diode 19 in its conducting state. Thus, as may be seen in FIGS. 2$a$ and 2$b$, at $t_1$, point B is driven to $+V_{DD}$ and point A is driven to $+V_{DD} + 1$ volt.

Almost immediately thereafter at time $t_2$ (for clarity the interval between $t_1$ and $t_2$ in FIG. 2$a$ is exaggerated) capacitor 16 begins to discharge through n-channel MOS-FET $Q_6$ at a rate determined by the maximum drain current of $Q_6$. As capacitor 16 discharges, the voltage at point A goes in a negative direction. At $t_3$ the voltage at point A again reaches and passes the threshold voltage $V_0$. The input to logic element 21 again goes through the threshold in the negative direction and the output of NAND gate 21 goes positive. As the output from NAND gate 21 goes positive, the conducting states of C-MOS-FET's $Q_2$ and $Q_5$ are again switched so that n-channel MOS-FET $Q_5$ conducts and p-channel MOS-FET $Q_2$ becomes non-conducting and point B is again connected to the negative $-V_{SS}$ terminal. Similarly, the conducting states of the C-MOS-FET's $Q_3$ and $Q_6$ in the charging and discharging path are switched so that n-channel MOS-FET $Q_6$ is driven into the non-conducting state and p-channel MOS-FET $Q_3$ into conduction again connecting point A to constant current source $Q_1$. As the voltage at point B is switched to $-V_{SS}$, point A is instantaneously driven negative by an amount equal to $\Delta V_1$ . Since capacitor $C_{16}$ cannot charge instantaneously at $t_3$ when p-channel MOS-FET $Q_3$ is driven into conduction, the voltage at point A goes instantaneously negative toward $V_0 - \Delta V_1$. However, the voltage excursion of point A in the negative direction is limited by diode 20 so that point A goes to negative by an amount equal to $-V_{SS}$ plus the forward drop across diode, or, $|-V_{SS}-1|$ volts. Capacitor 16 now begins to charge from constant current source $Q_1$ and the voltage across capacitor 16 and the voltage at point A again begins going in the positive direction. This process is repeated since the system is free-running and dependent on the voltage at point A to initiate switching.

The time required for capacitor 16 to charge so that point A again reaches the threshold voltage $V_0$ is obviously a function of the magnitude of the current $I_D$ from constant current source $Q_1$ since the capacitance is fixed for any given circuit. The period $T_R$, as will be shown in detail later, varies with $I_D$ and is defined by the expression $T_R = (-V_{SS}-V_0-1) \times C_{16}/I_D$. Since $-V_{SS}$, $V_0$ and $C_1$ are fixed for any given circuit configuration, it can be seen that the period $T_R$ and hence, the pulse rate is determined by the constant current source $Q_1$ since any changes in the magnitude of $I_D$ as a function of the input voltage controls the period and hence, the repetition frequency of the oscillator output. It will also be noted that since the capacitor charges from a current source which has a constant output current for any given level of input voltage, the charging and discharging of the capacitor is linear and may be readily varied by varying the level of the current.

As pointed out above, the time period for charging capacitor 16 and hence, the repetition frequency of the pulse rate is controlled by the magnitude of the drain current $I_D$ from constant current source $Q_1$ and hence, may be controlled by the input voltage. This may be readily seen from the following analysis. The voltage level on capacitor 16 is defined by the well-known formula:

$$Q = CV \tag{1}$$

Where $Q$ is the charge on the capacitor, $C$ is the capacitance of capacitor 16 and $V$ is the voltage across the capacitor. The current flowing into capacitor 16 is defined by the equation:

$$I = \frac{dq}{dt}. \tag{2}$$

The charge $Q$ is therefore the time integral of $Idt$, i.e., $$Q = \int I\,dt \tag{3}$$

Since the current is constant and equal to the drain current $I_D$ of p-channel transistor $Q_1$:

$$I = I_D \text{ and } Q = I_D \int dt \quad (4)$$

Thus, Q is $$Q = I_D t, \quad (5)$$

Substituting Equation (5) into Equation (1):

$$CV = I_D t \quad (6)$$

Since the capacitance is that of capacitor 16 and is fixed for any given oscillator, and the voltage V is determined by the maximum voltage excursion of point A when switching transistor $Q_2$ is switched off and $Q_5$ is switched on, namely $\Delta V = -V_{SS} - 1 - V_0$, the formula for the charging period $T_R$ of capacitor 16 is $$T_R = -V_{SS} - V_0 - 1 \times \frac{C_{16}}{I_D} \quad (7)$$

For any given circuit the values of $-V_{SS}$ and $V_0$ are fixed so that $$(-V_{SS} - V_0 - 1) = K = \Delta V. \quad (8)$$

Consequently, $$T_R = \Delta V\, C_{16}/I_D \quad (9)$$

The period $T_R$ of the generator thus varies inversely with the drain current $I_D$ and the repetition rate varies directly with $I_D$. Hence, the greater the drain current, the smaller the period, $T_R$, and the greater the repetition frequency of the voltage controlled oscillator.

The maximum required output frequency ($F_{max}$) for the Worst Case conditions under which the oscillator functions basically determined the value of $C_{16}$. By the Worst Case condition is meant the situation for a given C-MOS-FET and for a given maximum temperature since this establishes the minimum drain current available for a given input voltage to the constant current source. Once the value for $C_{16}$ for $F_{max}$ under the Worst Case condition is established, the voltage controlled oscillator operating range is from the value $F_{max}$ value to 6 decades below $F_{max}$, or in other words, a dynamic range of 6 decades.

By definition $F_{max}$ is the reciprocal of the total period:

$$F_{max} = \frac{1}{T_{Pmax} + T_{Rmax}} \quad (10)$$

where $T_{Pmax}$ is the Worst Case value of $T_P$ for the given biasing condition of n-channel transistor $Q_6$ and the given Worst Case temperature conditions, at which the frequency is maximum. Similarly, $T_{Rmax}$ is the Worst Case value of $T_R$ at the value of input voltage (i.e., gate to source voltage to the constant current source C-MOS-FET) at which the frequency is maximum, i.e., $$V_{gs} = V_0 - V_{th} \quad (11)$$

where $V_{th}$ is the threshold voltage of the p-channel transistor. The threshold voltage $V_{th}$ is that voltage at which the channel material changes from the original $n$ type to $p$ type. That is, there is a voltage at which a material is electrically neutral (intrinsic) and the channel is neither $n$ type nor $p$ type and this voltage is known as the threshold voltage $V_{th}$.

$T_{Pmax}$ is a function of $C_{16}$ and the minimum $I_D$ of n-channel MOS-FET $Q_6$. That is, the discharge of capacitor 16 through n-channel MOS-FET $Q_6$ under any condition is defined by the equation:

$$IT_p = C_{16}(V_{DD} + 1 - V_0) \quad (12)$$

or $$IT_p = C_{16}\, \Delta V_A \quad (13)$$

where $$\Delta V_A = V_{DD} + 1 - V_0 \quad (14)$$

The value of $T_p$ for the Worst Case condition is determined by the value of $I_D$ for the minimum value of n-channel saturated drain current, i.e., at the Worst Case temperature. Consequently, $I = I_{DSn}$ where $I_{DSn}$ is the saturated drain current at some value of temperature °C which represents the Worst Case condition.

Hence, $$T_{Pmax} = \frac{C_{16}\, \Delta V_A}{I_{Dns}} \quad (15)$$

$T_{Rmax}$, on the other hand, is a function of the capacitance of $C_{16}$ and the minimum drain current of the p-channel current source ($I_{DSp}$) at $$V_{gs} = V_0 - |V_{TH}| \quad (16)$$

for the worst temperature case. Consequently, $T_{Rmax}$ may be defined by the equation:

$$T_{Rmax} = \frac{C_{16}\, \Delta V_R}{I_{Dsp}} \quad (17)$$

where:

$$\Delta V_R = -V_{SS} - 1 - V_0 \quad (18)$$

Combining Equations 10, 15 and 17 results in the following expression for $F_{max}$:

$$F_{max} = \frac{1}{\frac{C_{16}\, dV_A}{I_{Dsn}} + \frac{C_{16}\Delta V_R}{I_{Dsp}}} \quad (19)$$

The capacitance pf $C_{16}$ required to reach a desired value of $F_{max}$ for any given combination of C-MOS-FET, Worst Case temperature and supply voltages may be calculated from Equation (19) by converting the general formulation into a specific expression for the given component and parameters. To give one example of this procedure, a specific expression for $C_{16}$ will be derived for the combination of a CD4007AD C-MOS-FET, a drain voltage $V_{DD} = +6$v; a source voltage $-V_{SS} = -6$, a logic threshold voltage $V_0 = 0$, a diode forward voltage drop of 1 volt and a Worst Case temperature of 125°C.

The minimum drain current of a CD4007AD n-channel MOS-FET at 125°C is:

$$I_{Dsn} = 3.5 \times 10^{-3} \text{ amps}$$

The minimum drain current of a CD4007AD p-channel MOS-FET at 125°C is $$I_{Dsp} = 1.75 \times 10^{-3} \text{ amps.}$$

For these circuit parameters:

$$T_{Pmax} = \frac{C_{16}(7)}{3.5 \times 10^{-3}} \tag{20}$$

$$T_{Pmax} = 2 \times 10^3 \times C_{16} \tag{21}$$

Similarly, $$T_{Nmax} = \frac{C_{16}(7)}{1.75 \times 10^{-3}} = 4 \times 10^3 \times C_{16} \tag{22}$$

Combining Equations (19), (20), and (21):

$$F_{max} = \frac{1}{2\times10^3\times C_{16}+4\times10^3\times C_{16}} = \frac{1}{6\times10^3\times C_{16}} \text{ Hz at } 125°\text{C} \tag{23}$$

Hence, $$C_{16} = \frac{167 \times 10^{-3}}{F_{max}} = \frac{167 \times 10^{-6}}{F_{max}} \text{ FARAD} \tag{24}$$

The value of capacitance for any $F_{max}$ may then be calculated from Equation (24). For example, if the desired $F_{max} = 5$MHz then $$C_{16} \frac{167 \times 10^{-6}}{5 \times 10^6} = 33 \text{ PICOFARAD}$$

Utilizing the nearest even value of $C_{16} = 30$ PICOFARAD the actual $F_{max}$ may be calculated from Equation (24):

$$F_{max} = \frac{1}{6 \times 10^3 \times 30 \times 10^{-12}} = 5.5 \text{ MHz}$$

Similarly, the values of $C_{16}$ and $F_{max}$ may be determined for any set of circuit components, parameters and temperatures.

Equations (22) and (23) which establish the relationship between $F_{max}$ and $C_{16}$ for any Worst Case temperature, may be used to determine the gain of the voltage controlled oscillator as a function of output frequency. For this purpose, $T_p$ will be set at 0 since it has negligible effect on gain at low frequency and tends to make gain linearity more favorable at high frequencies. Consequently, Equation (10) can be rewritten as:

$$F = \frac{1}{T_r} = \frac{I_D}{C_{16}(-V_{SS}-1-V_0)} \tag{25}$$

The current-voltage relationship of a saturated p-channel C-MOS transistor is:

$$I_D = K\,[V_{gs} - |V_{th}|]2 = K[V_{gs}^2 - 2V_{gs}|V_{th}| + |V_{th}|\,2] \tag{26}$$

$$\frac{dF}{dV_{gs}} = \frac{2K(V_{gs}-V_{th})}{C_{16}(V_{SS}-1-V_0} \tag{27}$$

By substituting Equation (26) into Equation (25) and differentiating the rate of change of frequency with respect to gate source voltage may be defined as:

$$\frac{dF}{dV_{gs}} = \frac{2K(V_{gs}-V_{th})}{C_{16}(V_{SS}-1-V_0} \tag{27}$$

From Equation (26) it can be seen that:

$$V_{gs}-V_{th} = \sqrt{\frac{I_D}{K}} \tag{28}$$

Substituting Equation (28) into Equation (27):

$$\frac{dF}{d_{Vgs}} = \frac{2\sqrt{I_D K}}{C_{16}(-V_{SS}-1-V_0)} \tag{29}$$

Since $F_{max}$ occurs at $I_{Dmax}$, Equation (25) can now be rewritten as:

$$C_{16} = \frac{I_{Dmax}}{F_{max}\Delta V_B} \tag{30}$$

where:

$$\Delta V_B = -V_{SS} - 1 - V_0$$

Substituting (30) back into Equation (25):

$$I_D = I_{Dmax}\left(\frac{F}{F_{max}}\right) \tag{31}$$

Substituting Equation (31) into (29):

$$\frac{dF}{dV_{gs}} = \sqrt{\frac{KI_{Dmax}}{C_{16}(-V_{SS}-1-V_0)}}\sqrt{F/F_{max}} \text{ Hz/V} \tag{32}$$

Utilizing the same CD4007AD C-MOS-FET, the value of $k = 0.2 \times 10^{-3}$ $A/V^2$. With $I_{Dmax} = 1.75 \times 10^{-6}$ and $V_{SS} = -6$ volts Equation (32) reduces to:

$$\frac{dF}{dV_{gs}} = 170 \times \frac{10^{-6}}{C_{16}} \times \sqrt{\frac{F}{F_{max}}} \text{ Hz per volt.} \tag{33}$$

It can be seen from Equation (33) that the rate of change of frequency with change in the input voltage with constant current source is not linear but varies inversely with the value of capacitance and linearly as the one-half power of the ratio of the operating frequency to the maximum frequency. However, it will be obvious that such a voltage controlled oscillator may be used in an environment where linearity of output is not required.

FIG. 3 shows an arrangement in which the voltage controlled oscillator is utilized in a phase locked loop in which a reference frequency is applied to one input of a phase detector 30 and compared to a feedback signal from the loop. The phase detector generates an error signal proportional to the phase difference between the reference frequency and the feedback signal. The feedback signal is the output of a voltage controlled oscillator of the type described above divided by a factor n, i.e., $$F_{fb} = \frac{F_1}{n}$$

The output of the phase detector is applied to an integrator 32 which integrates in the positive or negative direction depending on the polarity of the phase error. The change integrator output causes a corresponding change in the control voltage input to voltage controlled oscillator 31 and causes the output frequency of the VCO to change correspondingly in a direction to reduce the phase error. The output of the voltage controlled oscillator is applied to the digital divider 32 which divides the output frequency from the voltage controlled oscillator by a factor $n$ and an output digital divider 33 which divides the output frequency by a factor $m$. At steady state, the phase difference between $F_{ref}$ and $F_{feedback}$ is constant and as a result $F_{ref} = F_{fb}$. The input signal $F_1$ to digital divider 32 is therefore $F_1 = nF_{ref}$. If the $F_1$ signal from the voltage controlled oscillator is now divided by the factor m in digital divider 34 the output frequency $F_0 = n/m \times F_{ref}$. Thus, the wide band voltage controlled oscillator described above can be utilized in a frequency mulitplier/divider or utilizing a phase locked loop of the type shown in FIG. 3 and may be utilized in any number of applications where such mulitpliers/dividers or frequency synthesizers are utilized and operate over as wide frequency range thereby eliminating band switching and all the other alternative means hitherto used for producing a wide band frequency output range from a single oscillator.

It will be apparent from the previous description that a novel, voltage controlled oscillator has been described which has an extremely wide dynamic frequency range, a frequency range extending over six decades. In one example, such a wide range voltage controlled oscillator is described which has a frequency range from 5.5 MHz down to 50 Hz. Furthermore, the wide range voltage controlled oscillator is particularly applicable to manufacture through known integrated circuit techniques utilizing a plurality of C-MOS-FET devices which may be mounted on a single substrate or chip.

What is claimed as new and desired to be secured by Letters Patent of the United States is:

1. A voltage controlled oscillator comprising:

a. a voltage controlled constant current source including a Complementary Metal Oxide Semiconductor element;

b. an input terminal coupled to said constant current source adapted to receive an input voltage to vary the current level from said source as a function of the input voltage.

c. a storage element;

d. means including a Complementary Metal Oxide Semiconductor FET pair coupled between said constant current source and said storage element for alternately establishing a charging and discharging path for said storage element one of said FET elements connecting the storage element to said constant current source to charge said capacitor from said source and the other FET of said pair rapidly discharging said capacitor through said FET to a point other than the constant current source.

e. semiconductor switching means having an input coupled to said storage element and an output coupled to said means for establishing a charging and discharging path, said switching means being actuated in response to the voltage level on said storage element to connect said storage element intermittently to said constant current source to charge said element at a rate proportional to said current.

2. The voltage controlled oscillator according to claim 1 wherein said semiconductor switching means includes a complementary Metal Oxide Semiconductor FET pair having their gate electrodes coupled to said storage element to control the conducting states of the FET pair in response to the voltage level on said storage element and the drain electrodes of said C-MOS-FET pair being connected to the gate electrodes of the C-MOS-FET pair in said charging and discharging path.

3. The voltage controlled oscillator according to claim 1 wherein all the semiconductor elements in said current source, said charging and discharging path and the switching means are Complementary Metal Oxide Semiconductor FET's mounted on a common substrate.

4. The voltage controlled oscillator according to claim 1 including a voltage sensitive logic element coupled between said storage element and the input of said switch means, said logic element being responsive to the voltage level on said storage element to actuate the switching means.

5. The voltage controlled oscillator according to claim 4 wherein said voltage sensitive logic element is a NAND gate.

6. The voltage controlled oscillator according to claim 2 wherein a voltage sensitive logic element is coupled between said storage element and the gate electrodes of the C-MOS-FET pair of said switching means, the polarity of the output from said logic element is reversed when the voltage across said storage exceeds a reference level to switch the conducting states of C-MOS-FET's of the pair.

7. The voltage controlled oscillator according to claim 6 wherein said logic element is a NAND gate.

8. The voltage controlled oscillator according to claim 2 wherein the source electrode of one of the FET's in the charging and discharging path is connected to the constant current source, and the drain electrodes both FET's in the charging and discharging path are connected to said storage element whereby said storage element is charged from said constant current source whenever said one of the FET's is in the conducting state.

* * * * *